United States Patent [19]

Zorian

[11] Patent Number: 5,091,908
[45] Date of Patent: Feb. 25, 1992

[54] BUILT-IN SELF-TEST TECHNIQUE FOR READ-ONLY MEMORIES

[75] Inventor: Yervant Zorian, Princeton, N.J.

[73] Assignee: AT&T Bell Laboratories, Murray Hill, N.J.

[21] Appl. No.: 475,524

[22] Filed: Feb. 6, 1990

[51] Int. Cl.$^5$ .............................................. G11C 29/00
[52] U.S. Cl. .................................................. 371/21.5
[58] Field of Search .................... 371/25.1, 22.4, 21.1, 371/21.5

[56] References Cited

U.S. PATENT DOCUMENTS

| | | | |
|---|---|---|---|
| 3,582,633 | 6/1971 | Webb | 371/25.1 |
| 4,598,401 | 7/1986 | Whelan | 371/22.4 |
| 4,601,033 | 7/1986 | Whelan | 371/22.4 |

OTHER PUBLICATIONS

N. R. Saxena and E. J. McCluskey, "Arithmetic and Galois Checksums", IEEE Conference on Computer-Aided Design, Santa Clara, Ca., Nov. 1989, pp. 570-573.

N. R. Saxena and E. J. McCluskey, "Extended Precision Checksums", IEEE International Symposium on Fault-Tolerant Computing, Jun. 1987, pp. 142-147.

IBM Tech. Disc. Bull., vol. 27, No. 9, p. 5338, 2/1985.

IBM Tech. Disc. Bull., vol. 25, No. 7A, pp. 3166-3168, 12/1982.

IBM Tech. Disc. Bull., vol. 32, No. 2, pp. 426-427, 7/1989.

IBM Tech. Disc. Bull., vol. 26, No. 9, pp. 4483-4488, 2/1984.

Gordon et al., Hexadecimal Signatures Identify Trouble Spots in Microprocessor Systems, Electronics, 3/1977.

*Primary Examiner*—Jerry Smith
*Assistant Examiner*—Henry C. Lebowitz
*Attorney, Agent, or Firm*—Robert B. Levy

[57] ABSTRACT

Self-testing of a read only memory (10') containing an $m \times n+1$ array of single-bit storage cells (12') is accomplished by first loading the bits of a preselected quotient string into the $n+0$ column of the memory. The quotient string is typically preselected to yield an all-zero residue if no errors are present. Thereafter, a first polynomial division is performed on the entire contents of the memory by sequentially shifting out of the bits in the cells in each successive ROM row in a right-to-left direction into a separate one of the $n+1$ inputs of a bidirectional multiple input shift register (18'). A second polynomial division is then performed on the $m \times n$ contents of the memory (10') by sequentially shifting the bits out of each successive row into the shift register (18') in a left-to-right direction. As each row of bits is shifted into the shift register (18') during the second polynomial division, the register generates a quotient bit which is exclusively OR'd with a corresponding one of the quotient bits stored in the $n+1^{th}$ column of the memory, allowing for errors in the memory to be detected. At the conclusion of the second polynomial division, there remains in the register a residue, also indicative of the errors in the memory.

7 Claims, 2 Drawing Sheets

BUILT-IN SELF-TEST TECHNIQUE FOR READ-ONLY MEMORIES

TECHNICAL FIELD

This inventin relates to a technique for built-in self-testing of a Read-Only Memory (ROM) to verify its operation.

BACKGROUND OF THE INVENTION

Much effort is now being devoted toward designing digital electronic circuits which have the built-in capability of being "self-testing," that is, the ability to test their internal operation without the need for specialized test equipment. Developing a built-in self-test capability for a complex digital circuit containing separate structural elements is difficult because each different functional element often operates in a different manner. To simplify this task, many circuit designers use a "divide and conquer" strategy which entails developing a separate self-test routine for testing each separate structural element of the circuit.

To achieve complete self-testing of a complex digital circuit containing a read-only memory (ROM) comprised of an m×n matrix array of storage locations, a self-testing technique for the ROM is thus required. Presently, self-testing of a ROM is frequently accomplished by a technique known as "signature analysis". Signature analysis of a ROM is accomplished by sequentially shifting the stored bit out of each of the n cells in each successive one of the m rows of the ROM into a separate one of the inputs of a multiple input shift register (MISR) whose output is fed back to its input. As each bit is shifted into the corresponding one of the MISR inputs, the MISR exclusively OR's the bit with the bit previously received from the preceding column in the preceding row.

The bits of a selected sub-set of the exclusively OR'd bits are themselves exclusively OR'd and then fed back into the MISR input to enable the MISR to effectively perform a polynomial division on the ROM contents. At the completion of the polynomial division, there remains in the MISR a string of n bits which represents the remainder from the polynomial division and used as an indicator of the operation of the ROM. From a comparison of the actual residue to a reference value (which corresponds to the value of the residue when no faults are present), a determination can be made as to whether the ROM is faulty.

The advantage of the signature analysis technique for self-testing of a ROM is that the residue which remains in the MISR (representing the "signature" of the ROM) is only n bits long. Thus, by using signature analysis, the m×n bits of data stored in the ROM are effectively condensed or compacted into an n bit string. Consequently, if all possible error patterns are assumed to be equally likely, the possibility of error escape is $2^{-n}$. Although the likelihood of error escape using the conventional signature analysis may seen small, even a small likelihood of error is undesirable for high quality fault coverage. The error escape which occurs during conventional signature analysis is attributable to error masking and error cancellation. Error cancellation can occur each time each of a successive row of bits of the ROM is shifted into the MISR and is exclusively OR'd with the bit in the preceding column in the preceding row of the ROM thus, compacting the m×n bit ROM contents into an m+n−1 string. The bits which are exclusively OR'd in this manner are thus diagonally adjacent, and if each is erroneous, the errors tend to cancel each other out during the polynomial division. Consequently, the residue remaining in the MISR may not reflect the presence of an even number of erroneous, diagonally adjacent bits. Error masking arises from the compaction of the m×n−1 string into the n bit residue in the MISR. The compaction of the m×n bits in the ROM into an n bit MISR residue is effectively an m-to-1 mapping process. Failure to map one or more erroneous bits may give rise to an undetected error.

Therefore, there is a need for a self-test technique for a ROM which affords reduced incidence of error masking and error cancellation.

SUMMARY OF THE INVENTION

Briefly, in accordance with a preferred embodiment of the invention, a technique is provided for self-testing a ROM containing an m×n+1 bit array of storage cells, the n+1$^{th}$ column containing a separate one of a set of predetermined bits effectively leaving the remaining m×n array of cells available for conventional data storage. The first step is to perform a first polynomial division on the entire contents of the ROM by sequentially shifting each of the n+1 bits in each successive row into a separate one of the n+1 inputs of a bidirectional multiple input shift register (MISR) in a right-to-left direction. Thereafter, a second polynomial division is performed on the m×n contents of the ROM by sequentially shifting each of the first n bits in each successive row in the ROM into a separate one of the first n inputs of the MISR in a left-to-right direction. During the second polynomial division, the MISR produces a quotient bit after each of the first n bits in each successive row of the ROM is shifted into the MISR. Each successive quotient bit is exclusively OR'd with the bit stored in a successive one of cells in the n+1$^{th}$ ROM column, which is precalculated such that when exclusively OR'd with each successive quotient bit from the MISR, a zero results if no defect is present in the row of ROM bits. At the completion of the second polynomial division, the bits remaining in the MISR, (i.e., the residue) may be shifted out for comparison to a predetermined value representative of the expected MISR residue when no defects are present.

The above-described technique eliminates the incidence of error masking. By exclusively OR'ing the quotient produced by the MISR during each cycle of the second polynomial division with a successive one of the pre-calculated quotient bits in the n+1$^{th}$ column of the ROM, the effective length of the ROM signature becomes m+n−1 bits long. The increased length of the effective ROM signature results in no error masking since essentially no information is lost during the mapping of the m×n ROM bits into the ROM signature.

Error cancellation is greatly reduced by the present self-testing technique because the data in each row of the ROM is shifted into the MISR in opposite directions during each cycle of the first and second polynomial division, respectively. As a consequence, an even number of erroneous bits which lie on the same diagonal are unlikely to cancel each other as would otherwise occur if only a single polynomial division were performed.

DETAILED DESCRIPTION

Figure 1:
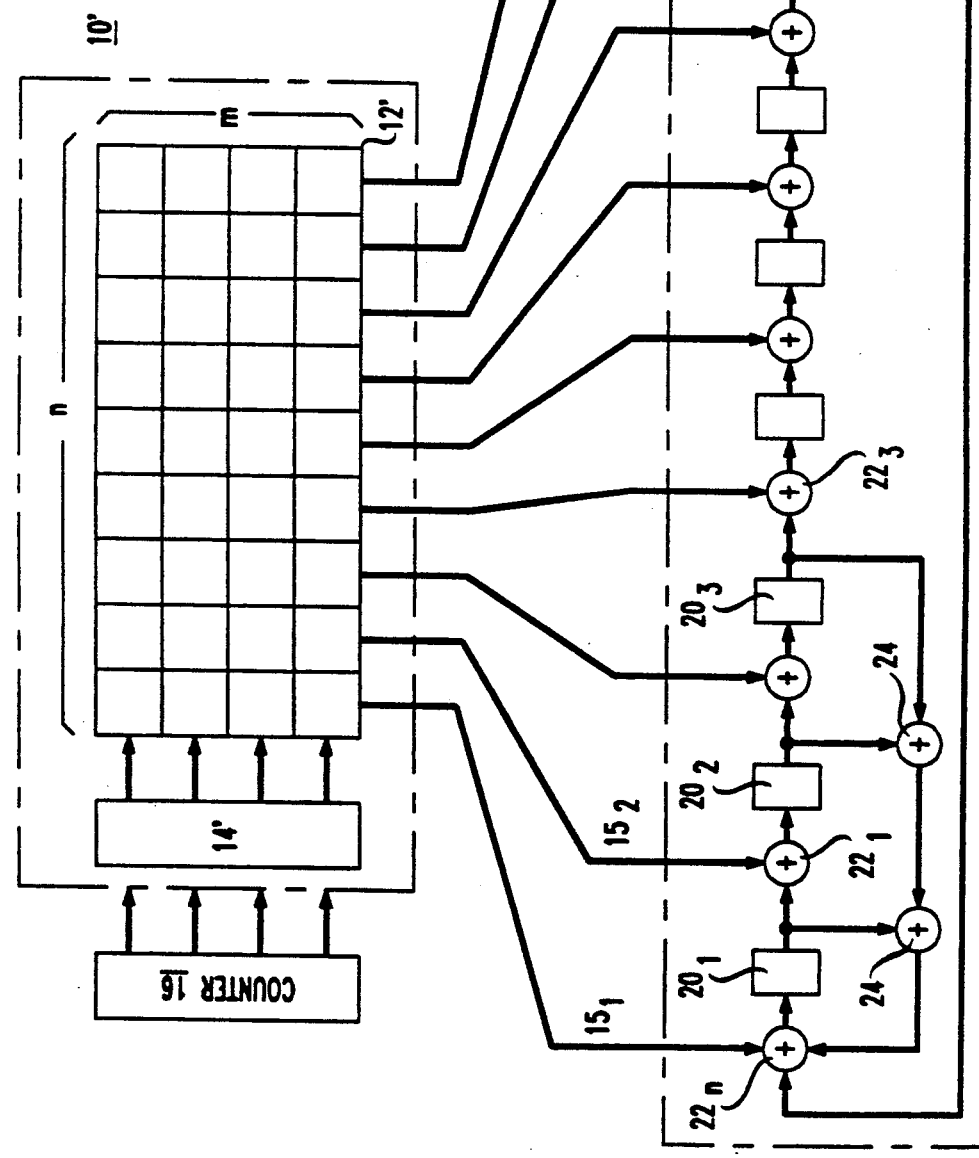
FIG. 1 is a block schematic diagram of an m×n bit, read-only memory (ROM) which is self-tested using a conventional signature analysis technique.

Before proceeding to describe the built-in self-test technique of the present invention, a thorough understanding of a conventional read-only memory (ROM) 10, as depicted schematically in FIG. 1, will prove helpful. The ROM 10 is comprised of plurality of storage cells 12 arranged in a matrix array of m rows by n columns, where m and n are integers. For purposes of illustration, the ROM 10 is comprised of a 4×9 array of cells 12 although ROMs having a greater or lesser number of cells are indeed possible. In practice, the number of rows in the ROM 10 usually exceeds the number of columns. Each individual storage cell 12, which stores a single bit of data, may be referenced as $12_{i,j}$ where i and j are integers which identify the particular row and column coordinates, respectively, of the cell. The ROM 10 also includes an input register/decoder 14 which, when supplied with the address of the $j^{th}$ cell 12 in the $i^{th}$ row, causes the bit stored in the cell to be output on the $j^{th}$ one of a set of output lines $15_1, 15_2, 15_3 \ldots 15_n$ of the ROM 10.

Conventional self-testing (signature analysis) of the ROM 10 is carried out with the aid of a counter 16 and a multiple input shift register (MISR) 18. The counter 16 supplies the register/decoder 14 with a monotonically increasing count indicative of the address of a successive row of storage cells 12 in the ROM 10 whose stored bits are to be output on a corresponding one of the ROM output lines $15_1, 15_2, 15_3 \ldots 15_n$, respectively.

The multiple input shift register 18 is comprised of n flip flops $20_1, 20_2, 20_3 \ldots 20_n$ arranged in a daisy chain. Each of the flip-flops $20_1, 20_2, 20_3 \ldots 20_n$ has its output coupled to a first input of a separate one of a set of exclusive OR gates $22_1, 22_2, 22_3 \ldots 22_{n-1}$, respectively, each gate having its output coupled to the input of a separate one of the flip-flops $20_2, 20_3, 20_4 \ldots 20_n$, respectively. Each of the exclusive OR gates $22_1, 22_2, 22_3 \ldots 22_{n-1}$ has a second input coupled to a separate one of the ROM output lines $15_2, 15_3, 15_4 \ldots 15_n$, respectively.

The flip-flop $20_1$ is supplied with the output signal of an exclusive OR gate $22_n$ which has three inputs. The first of the three inputs of the exclusive OR gate $22_n$ is supplied with the signal on the ROM output line $15_1$ while the second of the gate inputs is supplied with the output of the flip-flop $20_n$. The third of the inputs of the exclusive OR gate $22_n$ is supplied with the output signal of a selected group of the flip-flops $20_1, 20_2, 20_3 \ldots 20_n$ as supplied via a set of exclusive OR gates 24. The particular group of the flip-flops $20_1, 20_2, 20_3 \ldots 20_n$, whose output signals are exclusively OR'd before being supplied to the exclusive OR gate $22_n$, is selected such that the signals fed back to the flip-flop $20_1$ form a "primitive" polynomial, which establishes the divisor for the polynomial division performed by the MISR 18. A primitive polynomial causes the MISR 18 to generate $2^n - 1$ separate residues when no input is present at the MISR whereas a non-primitive polynomial causes the MISR to generate less than $2^n - 1$ separate residues.

Conventional self-testing (signature analysis) of the ROM 10 is carried out by initializing the counter 16 with the address of the row containing the cell $12_{1,1}$. The counter 16 then counts upward, thereby supplying the register/decoder 14 with the address of successive one of the rows of the ROM 10. Upon receipt of the address of a particular row, the bits stored in the cells 12 in the row are output on the corresponding one of the ROM output lines $15_1, 15_2, 15_3 \ldots 15_n$ for input into a corresponding one of the exclusive OR gates $22_n, 22_1, 22_2 \ldots 22_{n-1}$.

The process of shifting out the stored bits in each row in the ROM 10 into a separate one of the n inputs of the MISR 18 is repeated until the bits in the last row of the ROM are shifted out to the MISR. The effect of shifting the bits of each successive row of the ROM 10 into the MISR 18 (when configured as described) is to perform a polynomial division on the contents of the ROM, with the divisor being a polynomial established by the particular combination of the flip-flops $20_2, 20_3 \ldots 20_n$ whose output signals are fed back to the flip-flop $20_1$ through the exclusive OR gates 24. The remainder from the polynomial division performed by the MISR 18 is the residue, i.e., the bits remaining in the flip-flops $20_1, 20_2, 20_3 \ldots 20_n$. The successive bit output by the last flip-flop $20_n$ in the MISR 18 after each row of bits has been shifted into the MISR 18 represents a successive one of the bits in a quotient string (i.e., the quotient of the polynomial division) which is typically ignored in conventional signature analysis.

The residue in the MISR 18 after the polynomial division on the m×n contents of the ROM 10 is indicative of the operation of the ROM 10. Since, by their nature, the contents of the ROM 10 are expected to remain static once entered into it, the value of the residue remaining in the MISR 18 after the polynomial division should remain the same each time unless an error is present. By comparing the actual residue in the MISR 18 after the polynomial division is completed to a known value representing the expected residue for a defect-free ROM 10 (i.e., one whose bits are all correct), the errors, if any, in the ROM can be uncovered.

Self-testing of the ROM 10 by conventional signature analysis, as described above, is prone to two types of error escape. The first type of error escape is known as error cancellation. Error cancellation occurs because, as the bits in each successive row of the ROM 10 are shifted into the MISR 18, each bit is exclusively OR'd with the bit in the cell 12 in the immediately preceding column in the preceding row which is diagonally adjacent thereto thus compacting the m×n bits into an m+n−1 bit string. A better understanding of this phenomenon may be had by reference to Table I which illustrates how such error cancellation may occur within the 4×9 ROM 10 of FIG. 1.

TABLE I

| | | | | | | | | | | | |
|---|---|---|---|---|---|---|---|---|---|---|---|
| 0 | 1 | 1 | 0 | 1 | 1 | 0 | 1 | 1 | | | ROM 10 rows |
| | 0 | 0 | 1 | 0 | 0 | 1 | 0 | 1 | | | |
| | | 0 | 1 | 0 | 0 | 0 | 1 | 0 | 1 | 0 | |
| | | | 0 | 1 | 1 | 0 | 0 | 1 | 0 | 1 | 1 |
| 0 | 1 | 1 | 0 | 0 | 1 | 0 | 1 | 0 | 0 | 1 | 1 |

Each of the first four rows in the table represents each successive one of the four rows of bits of stored in the ROM 10 as they are shifted into the MISR 18. Each succeeding one of the first four rows in Table I is offset to the right of the row above it by one bit. The reason why each successive row is offset by one bit from each preceding one is because as each bit is output on a ROM line $15_i$ and enters the MISR 18, the bit is added to the bit received on the ROM line $15_{i-1}$ from the previous row. The last row of bits in the table represents the sum obtained by exclusiving OR'ing of the rows of ROM bits (as offset in the manner just described), so that the total number of bits in the last row will be $m+n-1$. The last row in Table I represents the dividend for the polynomial division performed by the MISR 18.

To appreciate the problem of error cancellation, assume that two diagonally adjacent bits in the ROM 10 erroneously appear as a zero, rather than a one, as indicated by those two "1" bits in Table I which are overstruck by a "0". Because of the one-bit offset between the rows of ROM bits as they are shifted into the MISR 18, the two diagonally adjacent, erroneous bits appear in the same column in Table I. Thus, when both of these diagonally adjacent bits are erroneously a "0", the resultant residue (obtained by exclusively OR'ing the bits in each of the first nine columns) will be the same because the two erroneous bits will cancel each other out. Thus, the resultant residue of the MISR 18 will remain the same even when these two ROM bits are erroneous.

Another type of error escape that occurs is known as error masking. Error masking arises when the $m+n-1$ string obtained by exclusively OR'ing the rows of ROM bits is compacted into an n bit residue during polynomial division. As a result of this compaction, some of the bits of the ROM signature are lost, and any errors contained in them will thus be masked.

Figure 2:
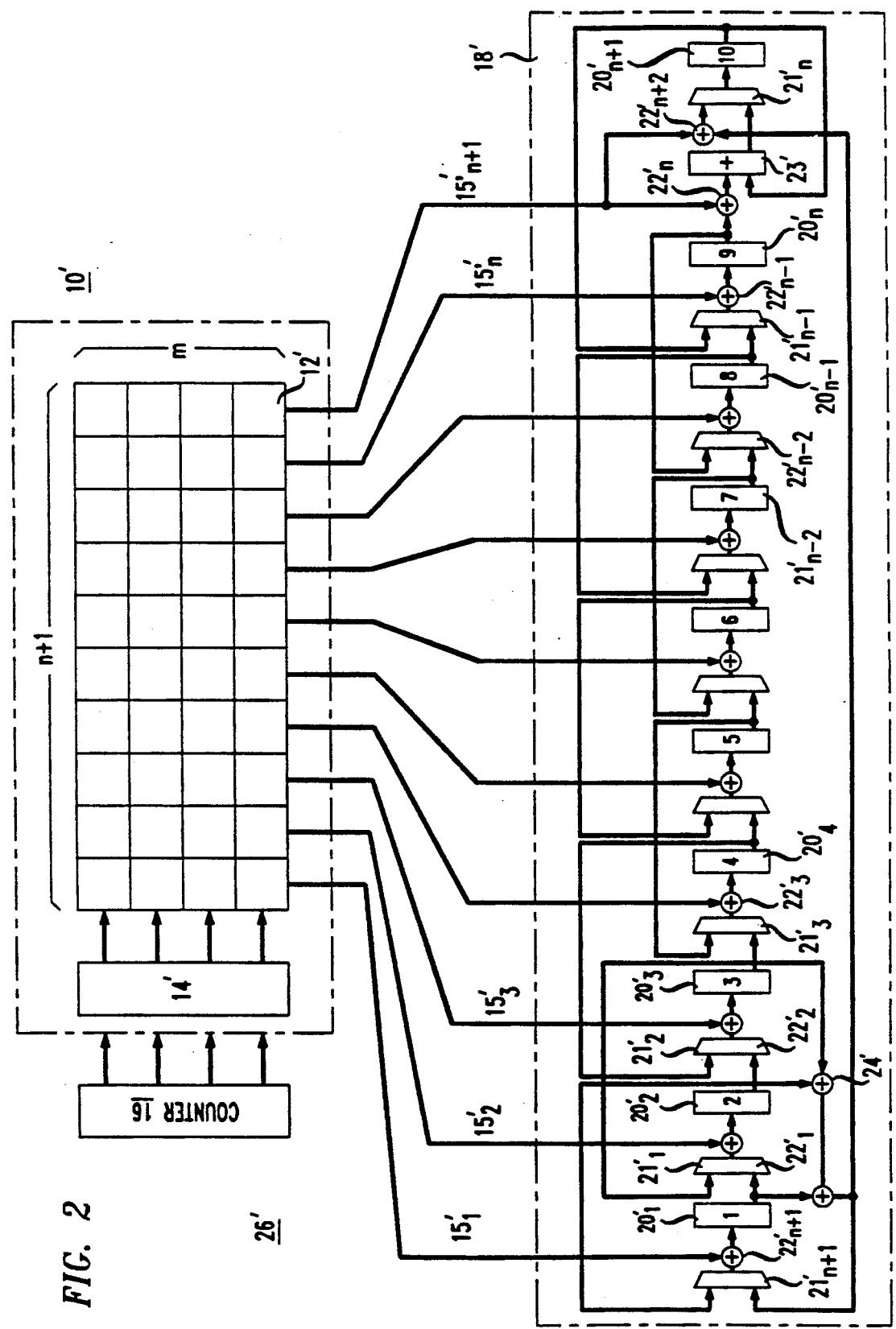
FIG. 2 is a block diagram of a m×n+1 bit ROM which is self-tested in accordance with the technique of the present invention.

Referring now to FIG. 2, there is shown a system 26' in accordance with the present invention, for self-testing a read-only memory 10' (ROM) with reduced incidence of error masking and error cancellation. The ROM 10' is configured of a matrix array of storage cells 12' and a register/decoder 14' for addressing an individual one of the storage cells just like the ROM 10 of FIG. 1. The only distinction between the ROM 10 of FIG. 1 and the ROM 10' of FIG. 2 is that the array of storage cells 12' is of a size $m \times n+1$, with the $n+1^{th}$ column of storage cells being employed to store data used in self-testing of the ROM as will be described later. Thus, while the ROM 10' contains an extra column of storage cells 12', its effective capacity for storing application data is only $m \times n$ bits, the same as the ROM 10 of FIG. 1. The bits stored in a separate one of the cells 12' in each row of ROM 10' (including those in the $n+1^{th}$ column) are output on a separate one of a set of ROM output lines $15'_1, 15'_2, 15'_3 \ldots 15'_n$ and $15'_{n+1}$, respectively, when the corresponding address of the cell is applied to the register/decoder 14'

The system 26' of the invention for self-testing the ROM 10' is comprised of a counter 16' identical to the counter 16 of FIG. 1, and a bidirectional multiple input shift register (MISR) 18'. The MISR 18' is configured differently than the MISR 18. In particular, the MISR 18' is configured of $n+1$ flip-flops $20'_1, 20'_2, 20'_3 \ldots 20'_{n+1}$ connected in daisy chain fashion. Each of the flip-flops $20'_1, 20'_2, 20'_3 \ldots 20'_{n-1}$ has its output coupled to a first input of a separate one of a set of multiplexers $21'_1, 21'_2, 21'_3 \ldots 21'_{n-1}$, respectively, each multiplexer having its output coupled to a first input of a separate one of a set of exclusive OR gates $22'_1, 22'_2, 22'_3 \ldots 22'_{n-1}$, respectively. The exclusive OR gates $22'_1, 22'_2, 22'_3 \ldots 22'_{n-1}$ each have a second input coupled to a separate one of the output lines $15'_1, 15'_2, 15'_3 \ldots 15'_n$, respectively, of the ROM 10'. The output of each of the exclusive OR gates $22'_1, 22'_2, 22'_3 \ldots 22'_{n-1}$ is coupled to the input of a separate one of the flip-flops $20'_2, 20'_3, 20'_4 \ldots 20'_n$, respectively.

The flip-flop $20'_n$ of the MISR 18' has its output coupled to a first input of an exclusive OR gate $22'_n$ whose second input is coupled to the ROM output line $15'_{n+1}$. The exclusive OR gate $22'_n$ has its output coupled to a first input of a conventional OR gate 23' whose second input is supplied of the output of the flip-flop $20'_{n+1}$. The output of the OR gate 23' is supplied to a first input of a multiplexer $21'_n$ whose output feeds the input of the flip-flop $20'_{n+1}$.

The flip-flop $20'_1$ is supplied at its input with the output of an exclusive OR gate $22'_{n+1}$ having a first input coupled to the ROM output line $15'_1$. The exclusive OR gate $22'_{n+1}$ has a second input coupled to the output of a multiplexer $21'_{n+1}$ having a first input supplied with the output of a particular group of the flip-flops $20'_2, 20'_3 \ldots 20'_n$, via a set of exclusive OR gates 24' so as to provide the MISR 18' with a "primitive" feedback polynomial. The feedback signal supplied to the second input of the multiplexer $21'_{n+1}$ is also supplied to a first input of an exclusive OR gate $22_{n+2}$ whose second input is supplied with the signal on the line $15'_{n+1}$. The output of the exclusive OR gate $22_{n+2}$ is supplied to the second input of the OR gate 23'.

As thus described, each flip-flop $20'_p$ has its output coupled through a corresponding multiplexer $21'_p$ and an exclusive OR gate $22'_p$ to the next downstream flip-flop $20'_{p+1}$, where p is an integer $1,2,3 \ldots n$. In this way, the bit latched in the flip-flop $20'_p$ is exclusively OR'd with the bit from the next row of the ROM on the ROM output line $15'_{p+1}$ before being input to the downstream flip-flop $20'_{p+1}$ as occurs during the operation of the MISR 18 of FIG. 1. Thus, the MISR 18' of FIG. 2 is operative to receive the bits shifted out of the ROM 10' on the ROM output lines $15'_1, 15'_2, 15'_3 \ldots 15'_n$ in a left-to-right direction in the same manner as the MISR 18 of FIG. 1.

However, unlike the MISR 18 of FIG. 1, the MISR 18' can also operate to receive the bits shifted out of the ROM 10 on the output lines $15'_{n+1}, 15'_n, 15'_{n-1}, 15'_{n-2} \ldots 15'_1$ in a right-to-left direction. To allow for data to be shifted into the MISR 18' in the right-to-left direction, the second input of each of the multiplexers $21'_1, 21'_2, 21'_3, 21'_4 \ldots 21'_{n-2}$ is supplied with the output of a separate one of the flip-flops $20'_3, 20'_4, 20'_5 \ldots 20'_n$, respectively. In this way, the output of a separate one of the flip-flops $20'_{n+1}, 20'_n, 20'_{n-1}, 20'_{n-2} \ldots 20'_3$ can be supplied to the input of a respective one of the flip-flops $20'_n, 20'_{n-1}, 20'_{n-2} \ldots 20'_1$. For example, a bit on the ROM output line $15'_{n+1}$, which has been shifted into the flip-flop $20'_{n+1}$, can then be input to the exclusive OR gate $22'_{n-1}$, together with the bit on the ROM line $15_n$, in order to shift a bit into the flip-flop $20'_n$. Similarly, the bit shifted into the flip-flop $20'_n$ and output thereby will be input, via the multiplexer $21'_{n-2}$ and the exclusive OR gate $21_{n-1}$, to the flip-flop $20'_{n-1}$ and so on. By appropriately controlling the multiplexers $21'_1, 21'_2, 21'_3 \ldots 21'_n$, the bits appearing on the output lines $15'_{n+1}, 15'_n, 15'_{n-1}, 15'_{n-2} \ldots 15'_1$ of the ROM 10' can be shifted in a right-to-left direction into the flip-flops $20'_{n+1}, 20'_n, 20'_{n-1} \ldots 20'_1$.

Figure 3:
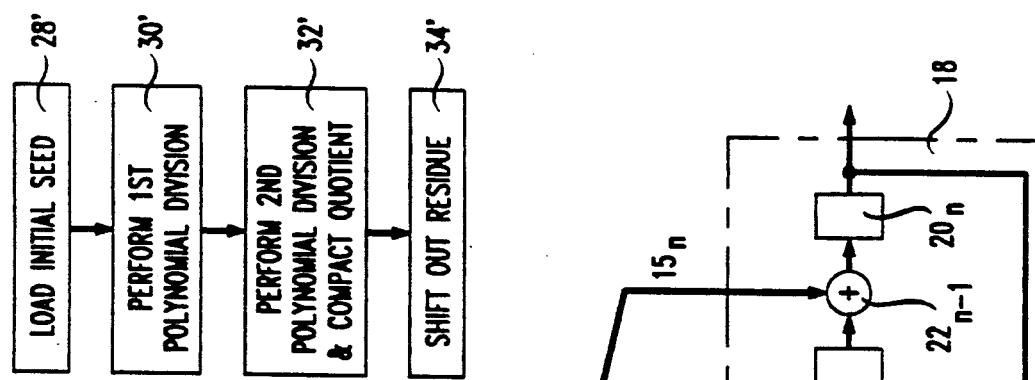
FIG. 3 is a flowchart diagram illustrating the manner in which the ROM of FIG. 2 is self-tested in accordance with the technique of the invention.

Referring to FIG. 3, there is shown a flow chart diagram illustrating the steps executed to self-test the ROM 10' of FIG. 2. The first step 28' in the process is to load an initial value (a "seed") into the MISR 18' in preparation to performing two successive polynomial divisions on the contents of the ROM 10'. The value of the seed is selected so that after both a first polynomial division is performed on the $m \times n+1$ contents of the ROM 10' and a second polynomial division is performed on the $m \times n$ ROM contents, the residue of the MISR 18' will be all zeros.

To establish the value of the seed, five successive polynomial divisions (stages) are performed, each polynomial division being performed by simulating the shifting of successive strings of bits into the MISR 18'. The first polynomial division is performed on a dividend consisting of the $m \times n$ contents of the ROM 10' (excluding the $n+1^{th}$ column of cells). Thus, the first polynomial division is performed by simulating the shifting of successive rows of zeros into the MISR 18'. The divisor polynomial ($P_1$) for the first stage division is chosen to be identical to the actual polynomial divisor of the MISR 18' of FIG. 2, which results upon the actual shifting of the bits in each successive row the ROM 10' into the MISR in a right-to-left direction. The seed (initial MISR contents) for the first stage polynomial division is chosen to be a string of zeros. Upon completion of the first stage polynomial division, a residue, (designated as the string $S_1$) is produced. The quotient string (e.g., the successive bits produced by the right-hand most flip-flop ($20'_1$) each time a successive row of bits is shifted into the MISR 18) is simply ignored.

Following the first stage polynomial division, a second stage polynomial division is then performed, again by simulating the shifting of strings of bits into the MISR 18' in a right-to-left direction. The dividend is chosen as all zeros while the polynomial divisor ($P_2$) is chosen to be the reciprocal of $P_1$. The seed for the second stage polynomial division is chosen as $S_1$, the residue remaining after the first stage polynomial division. At the completion of the second stage polynomial division, a residue $S_2$ remains. As before, the quotient string is simply ignored.

The second stage polynomial division is followed by a third stage polynomial division during which the $m \times n$ contents of the ROM 10' are divided by the polynomial $P_1$. This division, like the two which preceded it, is preformed by simulating the shifting of strings of bits into the MISR 18' in a right-to-left direction. The seed for the third stage polynomial division is the string $S_2$, the residue of the second stage division. The residue ($S_3$) at the completion of the third stage polynomial division will be a string of zeros. The quotient string (q) produced during the third stage division is saved and serves as the predetermined bit string which is loaded into the $n+1^{th}$ column of the ROM 10'.

A fourth stage polynomial division is next performed on the $m \times n+1$ contents of the ROM 10' by simulating the shifting of strings of bits into the MISR 18' in a left-to-right direction. The polynomial divisor ($P_3$) for the fourth stage polynomial division is the same as the actual polynomial divisor of the MISR 18' of FIG. 2 which occurs upon the shifting of the bits of each successive row of the ROM 10' into the MISR in a left-to-right direction. A string of all zeros is employed as the seed for the fourth stage polynomial division. At the completion of the fourth stage polynomial division, a residue $S_4$ is produced. Successive bits of a quotient string will also be output by the left-hand most flip-flop ($20'_{n+1}$) but these bits are ignored during this division.

After the fourth stage polynomial division, a fifth stage polynomial division is performed on a dividend consisting of all zeros in the same manner as during the fourth division. The polynomial divisor ($P_4$) for this division is the reciprocal of the polynomial $P_3$. The seed for this division is the exclusive sum of the residues $S_2$ and $S_4$ (obtained by exclusively OR'ing the $S_2$ and $S_4$). Following the fifth stage polynomial division, a residue $S_5$ remains. It is the residue $S_5$ which serves for the initial seed loaded into the MISR 18' during step 28'.

Referring to FIG. 3, following step 28', step 30' is executed, at which time, a first polynomial division is performed on the $m \times n+1$ contents of the ROM 10' of FIG. 2. The first polynomial division is carried out by causing the counter 16' to address the $n+1$ bits in each of the m rows of the ROM 10'. In this way, the bits stored in each row of the ROM 10' are output on the ROM output lines $15'_{n+1}$, $15'_n$, $15'_{n-1}$ ... $15'_1$. During this time, each of the multiplexers $21'_1$, $21'_2$, $21'_3$ ... $21'_n$ within the MISR 18' of FIG. 2 is operated such that each multiplexer only feeds the signal of a separate one of the flip-flops $20'_3$, $20'_4$, $20'_5$ ... $20'_{n+1}$ to a respective one of the flip-flops $20'_2$, $20'_3$, $20'_4$ ... $20'_n$. In this way, the bit appearing on a separate one of the ROM output lines $15'_{n+1}$, $15'_n$, $15'_{n-1}$ ... $15'_1$ can be shifted into a respective one of the flip-flops $20'_{n+1}$, $20'_n$, $20'_{n-1}$ ... $20'_1$ in a right-to-left direction.

The process of shifting out the $n+1$ bits in each successive row of the ROM 10' continues until the bits of the $m^{th}$ row have been shifted into the MISR 18', at which time, the first polynomial division is completed. At the completion of the first polynomial division, there remains in the MISR 18' a residue representing a "signature" of the ROM 10'. This signature is allowed to remain in the MISR 18'. During the process of performing the first polynomial division on the entire contents of the ROM 10', the flip-flop $20'_1$ will generate a successive one of the bits of a quotient bit string during each cycle of the polynomial division (i.e., during the shifting of each row of bits into the MISR). The bits in the quotient bit string generated during the first polynomial division are ignored.

Following step 30', step 32' is executed and a second polynomial division is performed, this time on only the $m \times n$ contents of the ROM 10'. In other words, the bits in the $n+1^{th}$ column are excluded. The second polynomial division is carried out by causing the counter 16' of FIG. 2 to address each of the first n bits in each successive row of the ROM 10' so that the bits appear on the ROM output lines $15'_1$, $15'_2$, $15'_3$ ... $15'_n$. During this time, the multiplexers $21'_1$, $21'_2$, $21'_3$ ... $21'_n$ within the MISR 18' are operated such that each only passes the output signal from its corresponding upstream flip-flop $20'_1$, $20'_2$, $20'_3$ ... $20'_{n-1}$ to the flip-flop immediately downstream therefrom. In this way, the bits in each of the m rows of the ROM 10' are shifted into the MISR 18' in a left-to-right direction.

The shifting of the first n bits in each successive row of the ROM 10' continues until the bits in the last row of the ROM have been shifted into the MISR 18. As the n bits in each ROM row are shifted into the MISR 18', the flip-flop $20'_n$ generates a bit representing a successive one of the bits in the quotient of the polynomial division performed on the $m \times n$ contents of the ROM 10'. Previously, the bits of the quotient string have been discarded. However, in accordance with the present invention, the bits in the quotient string produced during the second polynomial division during step 30' are in fact utilized to increase the effective size of the signature of the MISR 18 from n bits to m+n-1. By doing so, the likelihood of error masking is eliminated.

Referring to FIG. 2, as the n bits in each row of the ROM 10' are shifted into the MISR 18', the bit output by the flip-flop $20'_n$ (representing a successive one of the quotient bits) is input to the exclusive OR gate $22'_n$. The exclusive OR gate $22'_n$ exclusively OR's or compacts each quotient bit with a successive one of the bits stored in the $n+1^{th}$ column of the ROM 10'. Recall that the $n+1^{th}$ column of the ROM 10' was loaded with the quotient string generated at the completion of the third stage polynomial division during which the m×n contents of the ROM 10 were divided by the polynomial $P_2$. Also recall that at the completion of the third stage polynomial division, the resultant residue was a string of all zeros.

Since the polynomial divisor $P_2$ used during the third stage polynomial division is identical to the polynomial divisor used by the MISR 18' during step 32', a match should occur between each bit of the quotient string stored in the $n+1^{th}$ column of the ROM 10' and each bit of the actual quotient string produced during the second polynomial division when the residue in the MISR 18' is all zeros. Recall that a residue of all zeros is the expected result when no errors in the ROM 10 are present because of the manner in which the initial seed loaded into the MISR 18' is calculated during step 28' of FIG. 3. Thus, the actual quotient associated with the all-zero residue should match the quotient obtained during the third stage polynomial division (step 28') which is loaded in the $n+1^{th}$ column of ROM 10'.

Detection of whether a string of zeros results when the bits of the quotient string in the $n+1^{th}$ column in the ROM 10' are exclusively OR'd with the quotient string obtained during the second polynomial division of step 32' is accomplished with the aid of the OR gate 23'. The OR gate 23' acts as a "1's" detector by OR'ing the current output of the flip-flop $20'_{n+1}$ with the output of the exclusive OR gate $22'_n$. If, during any cycle of the second polynomial division performed during step 32', the exclusive OR gate $22'_n$ has output a "1," the flip-flop $20'_{n+1}$ becomes set. In this way, a "1" is returned to the input of the OR gate 23' so that a "1" appears at the output of the flip-flop $20'_{n+1}$ when a "1" is present in the actual quotient obtained during the second polynomial division of step 32'.

The process of exclusively OR'ing or compacting the quotient bits stored in $n+1^{th}$ column of the ROM 10' with the quotient bits produced during the second polynomial division effectively increases the size (length) of the residue in the MISR 18'. At the end of the second polynomial division, the flip-flops $20'_1$, $20'_2$, $20'_3$ . . . $20'_n$ contain the MISR 18' residue, which is thus n bits long. However, the true length of the MISR 18' is actually n−1 bits because of the one-bit offset which occurs during each cycle of the polynomial division. The effective length of the residue obtained after the second polynomial division executed during step 32' of FIG. 3 becomes n+m−1 bits, by virtue of exclusively OR'ing each quotient bit with each stored quotient bit in the $n+1^{th}$ column of the ROM 18'. The increase in the effective size of the MISR 18' residue means that none of the errors in the ROM 10' are lost (masked) during signature analysis.

Referring to FIG. 3, following the completion of the second polynomial division during step 32', the residue which remains in the MISR 18' is shifted out for analysis (step 34'). When no errors are in fact present, the resultant residue should be a string of all zeros since the initial seed loaded into the MISR 18' during step 28' was selected to yield just such a result after performing the first and second polynomial division. Thus, by examining the residue shifted out of the MISR 18', a determination can be made whether the ROM 10' contains any errors.

As described, the present self-testing technique affords the advantage of effectively increasing the size of the MISR 18' residue which eliminates the liklihood of error masking. Another advantage of the present technique is its reduced susceptibility to error cancellation. Such reduced susceptibility to error cancellation results from subjecting the m×n contents of the ROM 10' to both a first and second polynomial division performed by shifting bits in each successive row of the ROM into the MISR 18 in a first direction (left-to-right) and then a second direction (right-to-left), respectively. Referring to Table I, when a first polynomial division is performed on the contents of the ROM 10 of FIG. 1, error cancellation can occur because an erroneous bit in one row may be cancelled by a diagonally adjacent erroneous bit in the next successive row. However, when a second polynomial division is carried out by successively shifting the bits in each successive row of the ROM 10' into the MISR 18' in the opposite direction, the erroneous pair of bits which were diagonally adjacent during the first polynomial division is no longer diagonally adjacent as seen in Table II.

TABLE II

|   |   |   |   | 0 | 1 | 1 | 0 | 1 | 1 | 0 | 1 | 1 |
|---|---|---|---|---|---|---|---|---|---|---|---|---|
|   |   |   | 0 | 0 | 1 | 0 | 1 | ∅ | 1 | 0 | 1 |   |
|   |   | 0 | 1 | 0 | 0 | 0 | 1 | 0 | 1 | 0 |   |   |
| 0 | 1 | 1 | ∅ | 0 | 1 | 0 | 1 |   |   |   |   |   |
| 0 | 1 | 0 | 1 | 0 | 0 | 0 | 1 | 0 | 0 | 0 | 1 |   |

Thus, the present self-testing technique, which is carried out by performing two separate polynomial divisions in opposite directions, is much less susceptible to error cancellation.

The present self-test technique can easily be "built-in" (i.e., incorporated) into the structure of a ROM, such as the ROM 10', in the same way that the conventional signature analysis technique may be incorporated. To incorporate the present technique, the number of storage cells must be expanded to include an extra column to store a set of predetermined quotient bits. Secondly, the MISR 18 of FIG. 1 must be replaced with the MISR 18' of FIG. 2. Lastly, two separate polynomial divisions are required.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for self-testing a read-only memory (ROM) configured of an m row by n+1 column array of single-bit storage cells, where m and n are integers, the $n+1^{th}$ column containing a set of predetermined bits, comprising the steps of:

performing a first polynomial division on the $m \times n+1$ bits stored in the ROM by inputting the $n+1$ bits in each successive row of the ROM to a bidirectional multiple input shift register (MISR) initialized with a predetermined seed and shifting said $n+1$ bits in each successive ROM row through the MISR in a first direction;

performing a second polynomial division on the first n bits in each of the m rows of the ROM by inputting n bits in each successive row of the ROM into the MISR and shifting said n bits through the MISR in a second opposite direction, such that at the completion of the second polynomial division, a residue remains in the MISR;

simultaneously generating a quotient bit in the MISR as each of the first n bits in each successive row of the ROM are shifted in the second direction through the MISR;

logically combining each successive one of the quotient bits generated by the MISR with a separate one of the predetermined bits stored in the $n+1^{th}$ column of the ROM;

detecting if a bit of a preselected state results when each separate bit in the $n+1^{th}$ column of the ROM is logically combined with each separate quotient bit generated by the MISR, and if so, then indicating an error in the ROM; and examining the residue remaining in the MISR after the second polynomial division to detect the presence of an error in the ROM.

2. The method according to claim 1 wherein prior to performing the first polynomial division, the MISR is initialized with a seed which is selected such that at the completion of the first and the second polynomial division, the residue remaining in the MISR consists of all zeros when no errors in the ROM are present.

3. The method according to claim 2 wherein the seed is established by the steps of:

performing a first stage polynomial division on a dividend consisting of the contents of ROM (excluding the $n+1^{th}$ column) using a first polynomial divisor ($P_1$) and using an initial seed of all zeros, the first stage polynomial division yielding a residue $S_1$;

performing a second polynomial division on a dividend of all zeros using a divisor polynomial $P_2$ equal to the reciprocal of $P_1$ and using an initial seed equal to $S_1$, the second polynomial division yielding a residue $S_2$;

performing a third stage polynomial division on a dividend consisting of the contents of the ROM (excluding the $n+1^{th}$ column) using the polynomial $P_1$, the third polynomial division yielding a quotient string q and a residue $S_3$;

performing a fourth stage polynomial division on the entire contents of the ROM using a third polynomial divisor $P_3$ and seed of all zeros, the fourth polynomial division yielding a residue $S_4$; and performing a fifth stage polynomial division on a dividend of all zeros using a polynomial divisor $P_4$ equal to the reciprocal of $P_3$ and a seed obtained by logically OR'ing the residues $S_2$ and $S_4$, the fifth stage polynomial division yielding the initial seed for the MISR.

4. The method according to claim 3 wherein the quotient string stored in the $n+1^{th}$ column of the ROM is the quotient string produced at the completion of the third stage polynomial division.

5. The method according to claim 1 wherein the bits stored in the $n+1^{th}$ column of the ROM are precalculated such that when each bit is logically combined with a corresponding one of the quotient bits generated by the MISR, the resultant bit is a zero.

6. Apparatus for self-testing a ROM containing an m row by $n+1$ column matrix array of single bit storage cells, the $n+1^{th}$ column of the ROM containing a predetermined quotient string, the apparatus comprising:

counter means for addressing each row of the ROM to cause the bits stored in each row to be shifted out;

bidirectional multiple input shift register (MISR) means for: (a) performing a first polynomial division on the bits stored in the entire $m \times n+1$ array of ROM storage cells as the bits are shifted out from the ROM and through the MISR means in a first direction; (b) performing a second polynomial division on the bits stored in an $m \times n$ array within the $m \times n+1$ array of ROM storage cells as the bits in each of the first n columns of each row are shifted through the MISR means in a second direction, and generating a residue following such division; (c) producing a quotient bit as each of the n bits in each successive row is shifted through the MISR during the second polynomial division; (d) logically combining each successive quotient bit with a separate one of the bits stored in the $n+1^{th}$ column of the ROM; and (e) detecting whether each bit resulting from the logical combination of the produced quotient bit and the stored quotient bit is of a predetermined state; and means for comparing the residue generated after the second polynomial division with a known good residue.

7. The apparatus according to claim 6 wherein the MISR means comprises:

$n+1$ flip-flops $f_1, f_2, f_3 \ldots f_{n+1}$, each having an input and an output;

a set of multiplexers $m_1, m_2, m_3 \ldots m_{n+1}$, each of the multiplexers $m_1, m_2, m_3 \ldots m_{n-1}$ having a first input coupled to the output of a separate one of the flip-flops $f_1, f_2, f_3 \ldots f_{n-1}$ and a second input coupled to the output of a separate one of the flip-flops $f_3, f_4, f_5 \ldots f_{n+1}$, and an output, the multiplexer $m_n$ having a first input, a second input, and an output, the output coupled to the input of the flip-flop $f_{n+1}$, the multiplexer $m_{n+1}$ having a second input coupled to the output of the flip-flop $f_2$, and a first input supplied with a feedback signal from the selected set of the flip-flops $f_1, f_2, f_3 \ldots f_{n+1}$;

a set of exclusive OR gates $o_1, o_2, o_3, o_4 \ldots o_{n+2}$, each of the first $n-1$ gates $o_1, o_2, o_3, o_4 \ldots o_{n-1}$ having a first input coupled to the output of a separate one of the multiplexers $m_1, m_2, m_3 \ldots m_{n-1}$, respectively, a second input supplied with a separate one of the bits stored in the second through the $n^{th}$ columns of a successive row of the ROM as they are shifted out of the ROM, and an output coupled to the input of a separate one of the flip-flops $f_2, f_3, f_4 \ldots f_n$, respectively, the gate $o_n$ having a first input supplied with the output signal of the flip-flop $f_n$, and a second input supplied with the bit stored in the $n+1$ column of a successive row of the ROM, and an output, the gate $o_{n+1}$ having a first input supplied with the output of the multiplexer $m_{n+1}$, a second input supplied with the bit stored in the first column of a successive row of the ROM as the bit is shifted out of the ROM, and an output coupled to the input of the flip-flop $f_1$, the gate $o_{n+2}$ having a first input supplied with a feedback signal of the selected flip-flops $f_1, f_2, f_3 \ldots f_n$, a second input supplied with a separate one of the bits of the $n+1^{th}$ column of the ROM, and an output coupled to the second input of the multiplexer $m_n$; and an OR gate having a first input supplied with the output of the exclusive OR gate $o_n$, a second input supplied with the output of the flip-flop $f_{n+1}$ and an output supplied to the first input of the multiplexer $m_n$.

* * * * *